United States Patent [19]

Shrewsbury

[11] Patent Number: 4,893,086

[45] Date of Patent: Jan. 9, 1990

[54] BAR-TO-BAR ARMATURE TESTER

[76] Inventor: Junior R. Shrewsbury, 2628 Bland Rd., Bluefield, W. Va. 24701

[21] Appl. No.: 301,045

[22] Filed: Jan. 24, 1989

[51] Int. Cl.$^4$ .............................................. G01R 31/34
[52] U.S. Cl. ................................... 324/545; 324/523; 324/511; 324/149
[58] Field of Search ............................... 324/545–547, 324/555, 556, 506, 510, 511, 65 P, 64, 149, 72.5, 158 P, 156, 115; 439/709, 482, 483

[56] References Cited

U.S. PATENT DOCUMENTS

| | | | |
|---|---|---|---|
| 1,494,232 | 10/1921 | Friedly | 324/545 |
| 2,440,044 | 4/1948 | Greenslade | 324/64 |
| 2,463,567 | 3/1949 | Samstag | 324/545 |
| 2,515,623 | 7/1950 | Williams et al. | 324/545 |
| 3,447,078 | 5/1969 | Levy | 439/482 X |
| 3,609,545 | 9/1971 | Engelhard | 324/156 |
| 3,735,254 | 5/1973 | Severin | 324/64 |
| 4,053,830 | 10/1977 | Porter | 324/545 |
| 4,651,086 | 3/1987 | Domenichini et al. | 324/64 |
| 4,696,189 | 9/1987 | Hochreuther | 324/149 X |

Primary Examiner—Reinhard J. Eisenzopf
Assistant Examiner—Jack B. Harvey
Attorney, Agent, or Firm—Sherman & Shalloway

[57] ABSTRACT

A portable bar-to-bar armature tester for testing motor armatures for adequacy of their coil windings is disclosed. The tester is to be held by hand, such that four electrical probes, which extend out of the forward end of the tester, contact with four adjacent commutator bars of the armature to be tested. The tester includes a voltmeter in circuit with two of the four probes, and a toggle switch, a rheostat and a D.C. source in circuit with the two other of the four probes. The circuitry is all housed in a hard plastic casing to protect the circuitry from electrical contact with other objects and to protect the circuitry from damage due to dropping or dirt accumulation. The four electrical probes are laterally adjustable and are contacted with four adjacent commutator bars to determine whether the coil windings, are unbroken and properly wound.

11 Claims, 4 Drawing Sheets

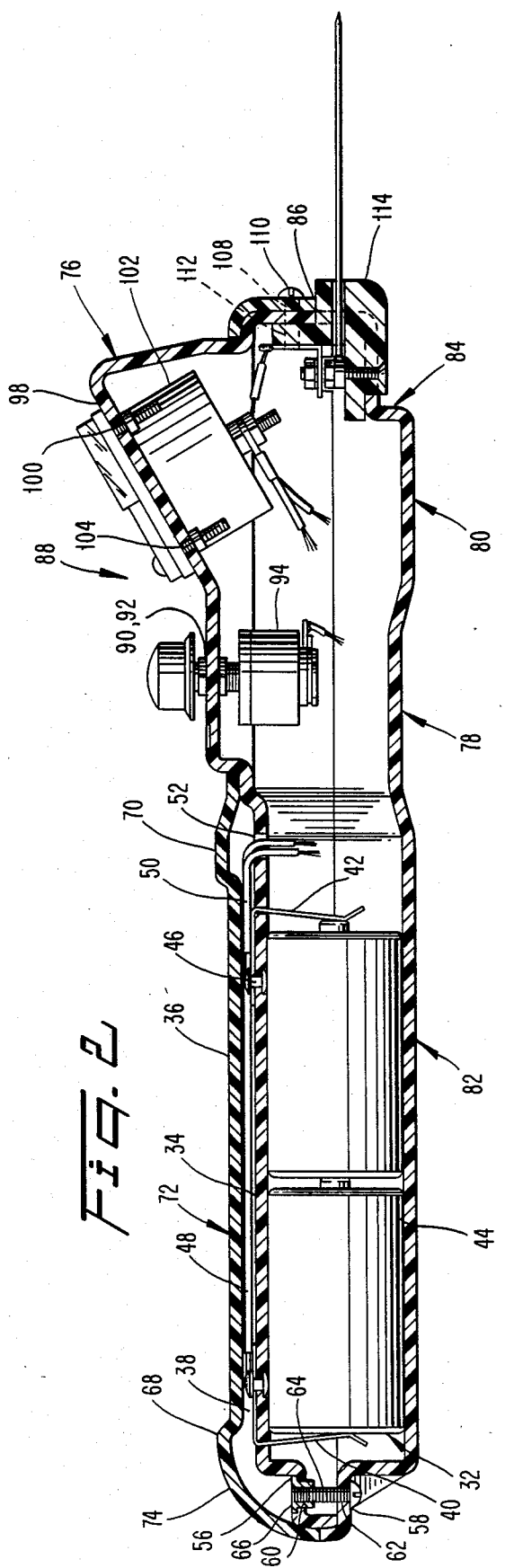
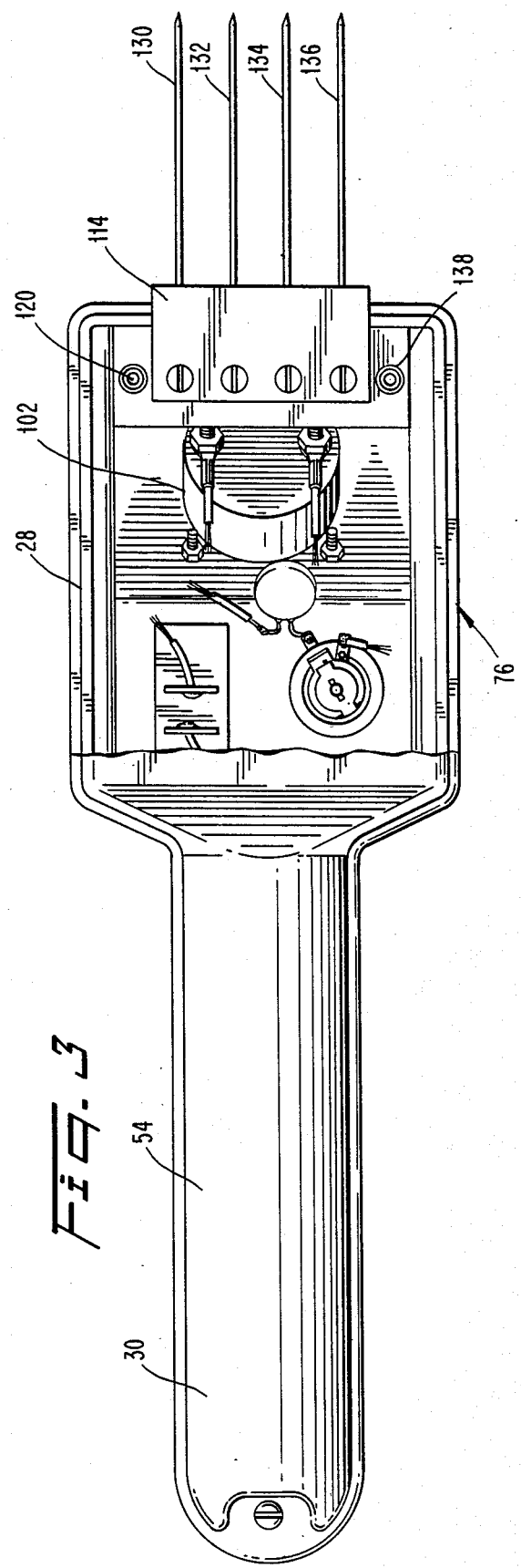

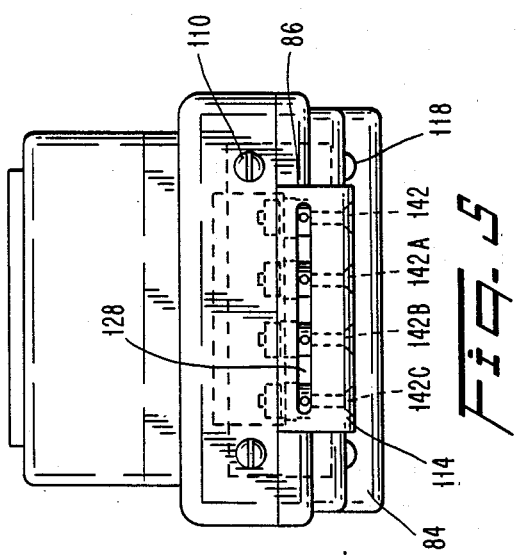
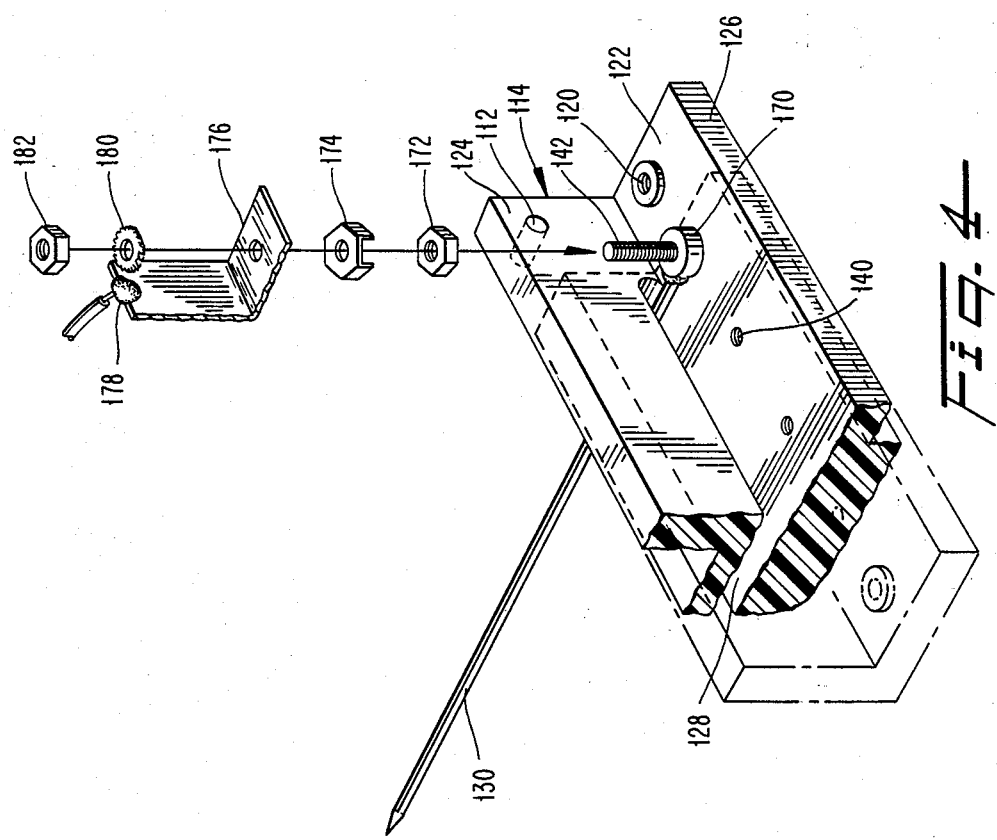

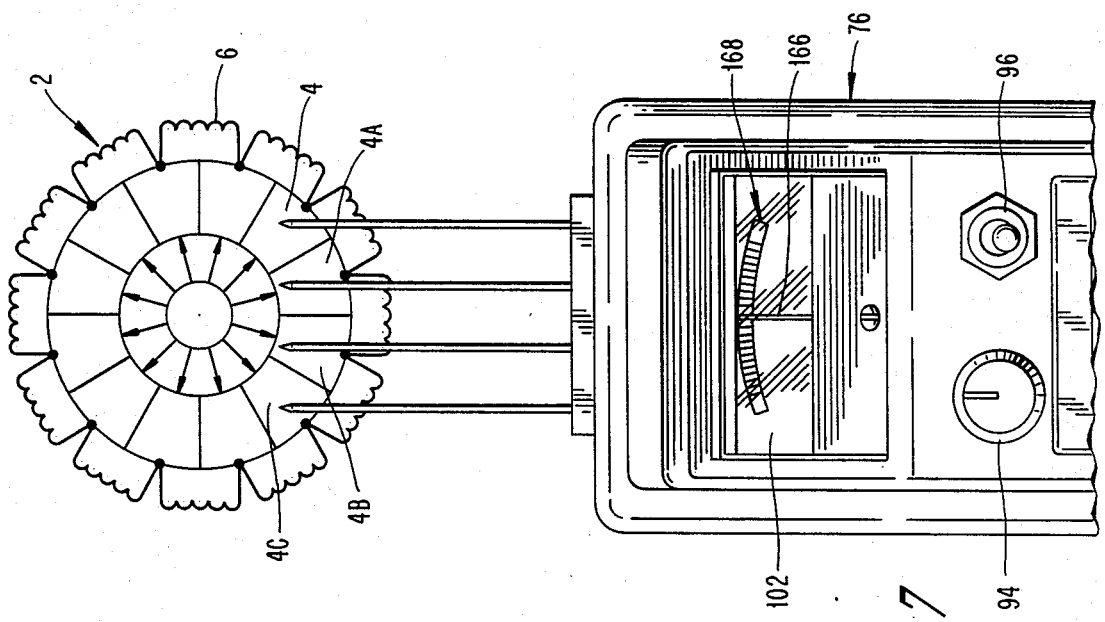
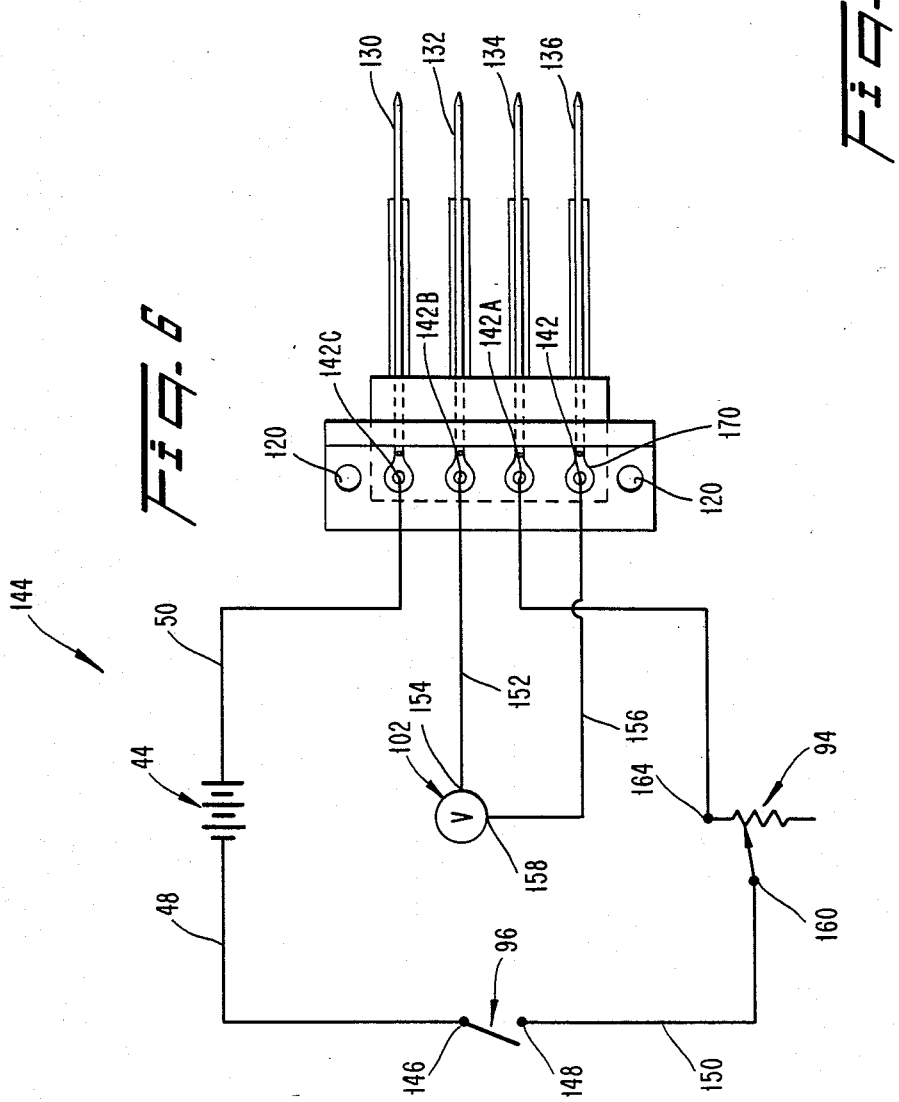

BAR-TO-BAR ARMATURE TESTER

BACKGROUND OF THE INVENTION

1. Field of the Invention

This invention relates to electrical testing devices and more particularly to a bar-to-bar armature tester for determining the presence of shorted coils, open circuits, or reverse windings.

2. Description of the Prior Art

Various attempts have been made in the prior art to provide an adequate tester for testing coil windings of an armature. The prior art devices however have been unreliable, expensive and/or complicated.

One such device is disclosed in U.S. Pat. No. 1,494,232 to Friedly. This device is a relatively large and complicated unit designed for testing not only armature coil windings but also for testing various other electrical equipment. The Friedly device requires the user to connect the probe ends into the proper terminals and to place the probes by hand onto the proper commutators. Furthermore, Friedly's testing device is adapted to detect short circuits and open circuits of the coils but does not provide for an indication that a coil has become reversed by cross winding or the like. Also, Friedly has no provision for adjusting the voltmeter; and therefore, cannot properly indicate the status of the coil for all sizes of armature since there would be no way to adjust the reference voltage.

Another prior art armature testing device is disclosed in U.S. Pat. No. 2,463,567 to Samstag. Samstag has overcome one problem of portability but includes many other disadvantages, such as the fact that all of the circuitry of the testing device is exposed and can be readily shorted-out by contacting the armature to be tested. Furthermore, the Samstag device provides no protection against damage due to dropping of the device, nor against damage caused by collection of dirt in the instrumentation of the device. The probes which contact the device to be tested are connected onto the testing device by way of wing nuts which along with the circuitry leading up to the probes are exposed and may come in contact with armature coil windings and cause improper readings. Samstag utilizes a millimeter, a rheostat and a single battery in circuit. The circuitry contemplated by Samstag is such that energy from the battery is lost in the rheostat prior to sending the current to the armature; thereby, causing unnecessary power loss and shortening of the life of the battery. Furthermore, Stamstag's device is contemplated as being used on armatures before being taken out of the motor and not for use in repairing or rewinding an armature in a repair shop.

SUMMARY OF THE INVENTION

It is an object of the present invention to overcome the aforementioned shortcomings of the prior art. More particularly, the present device is a very compact portable hand held testing device particularly adapted for use in repair and rewind shops. The design of the present invention is such that a volt meter is readily visible on the face of the device during testing, an on-off switch is provided conveniently below the voltmeter, and a rheostat for adjusting the reference point of the voltmeter is also provided on the face of the device. Furthermore, the invention comprises a hollow housing which encloses all of the circuitry to protect it from damage and from contact with the apparatus being tested. The hollow housing includes an elongated tubular handle and a hollow, substantially rectangular control section formed as a single unit. At the top of the housing is provided a terminal block within which are attached four elongated electrical probes. The probes are substantially parallel and are adjustable within the terminal block so that they may be adapted for use with different sized armatures. The terminal block, as well as the housing, is formed of nonconductive synthetic material so that during testing if inadvertent contact is made with the apparatus being tested, a short circuit or an improper reading will not result. The terminal block is a unit separate from the housing and can be readily detached therefrom for repair or replacement.

A DC source such as a battery or batteries, a rheostat and a single pole toggle switch are connected in circuit with two of the four probes, and a voltmeter is connected in circuit with the other two of the four inner probes. Thus, when the four probes of the device are contacted with four adjacent commutator bars of the armature and the toggle switch is closed, the DC energy source creates a voltage across the two probes connected therewith and thus across the coil connecting the commutator bar being tested. The two probes in circuit with the D.C. source contact the two corresponding commutator bars and create a voltage thereacross which is thus detected by the volt meter. The voltmeter will then indicate, based upon the amount of voltage thereacross, the status of the coil which connected into the commutator bar being tested.

This circuit design allows the reference voltage of the voltmeter to be adjusted by way of the rheostat, and requires less energy from the DC source.

This bar-to-bar armature tester is designed to provide accurate indication of the status of the armature coils, yet remain very portable and easy to operate. Furthermore, the construction of the tester is such that it will be relatively inexpensive and easily affordable by the normal artisan.

BRIEF DESCRIPTION OF THE DRAWING FIGURES

The invention will be further described with reference to the accompanying drawings in which:

FIG. 2 is a cross-sectional view taken along line II—II of FIG. 1;

FIG. 3 is a bottom partially cut-away view of the invention;

FIG. 4 is a partially exploded, partially cut-away view of the terminal block and terminal connections;

FIG. 5 is a front end view of the invention;

FIG. 6 is a schematic diagram showing the circuitry of the present invention; and FIG. 7 shows the manner in which the invention contacts an armature.

DETAILED DESCRIPTION OF THE INVENTION

Figure 1:
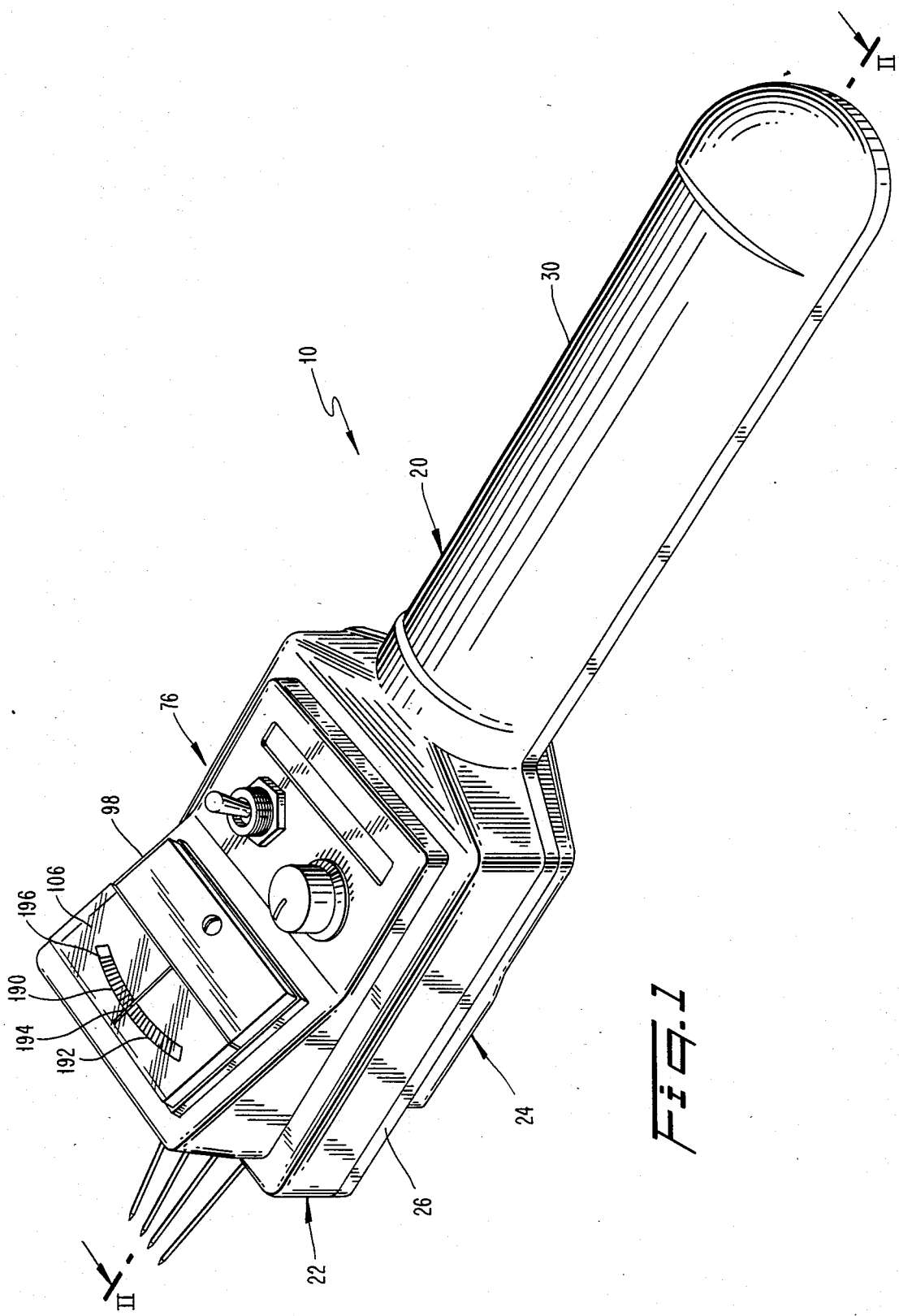
FIG. 1 is a perspective view of the tester contemplated by the present invention.

Reference is now made to the drawings wherein the testing device is shown generally at 10. The housing for the testing device is shown generally at 20 and is split along a horizontal plane into an upper casing 22 and a lower casing 24. The lower casing portion 24 includes an outwardly stepped flange 26 about its periphery which complimentarily mates with an inwardly stepped flange 28 of the upper casing portion 22. The rearward portion of the housing is formed into a tubularly shaped handle portion 30 which defines a battery casing 32. The upper casing portion 22 of the handle portion 30 includes an inner skin 34 and an outer skin 36 and a channel 38 defined therebetween. The battery terminals 40, 42 are connected to the inner skin portion 34 in a manner to allow space for a D.C. electrical source 44, preferably two D-cell batteries, therebetween. These terminals 40, 42 are fastened to the inner skin 34 by rivets 46 or the like. A space between the inner and outer skins defines a channel 38 through which the wires 48, 50 which connect to the battery terminals 40, 42 extend. An aperture 52 is formed in the inner skin 34 forwardly the forwardmost battery terminal 42 through which the wires 48, 50 exit the channel 38. The sidewalls 54 of the inner skin 34 are formed with inwardly beveled corners to provide lateral support for the batteries.

The rearward end of the battery portion includes upper 56 and lower 58 stepped flanges and mutually registering holes 60, 62 formed therethrough for receipt of a screw 64 to fasten together the upper and lower casing portions of the handle. It is preferred that a threaded metal sleeve 66 is inserted in the hole 60 in the stepped portion 56 of the upper casing to receive the screw 64 and provide a more reliable holding force. The upper casing portion of the handle includes rearwardly 68 and forwardly 70 located step portions on the outer surface thereof to provide a hand-gripping section 72 therebetween. Furthermore, the rearward end 74 of the handle portion is preferably rounded so that it will not include sharp corners which could injure the operator or become easily damaged.

A control section 76 is formed integral with and attached to the forward end of the handle portion 30. The control section is wider than the handle portion and is generally rectangular. The lower casing portion of the control section includes on its under side an inwardly stepped portion 78 and an outwardly protruding base portion 80 which, along with the bottom 82 of the handle portion, provide a stable three point base upon which the tester may rest. This provides the device with three point stability when set on its bottom surface. Forwardly of the outwardly protruding base portion is an inward step 84 provided so that the forward bottom portion of the device will not come into contact with the armature 2 to be tested. An opening 86 is provided in the lower casing portion at the forward end thereof into which a terminal block (to be described later) is to be inserted.

On the upper side of the upper casing portion of the control section is provided a face section 88 which includes openings for insertion of various controls. Two apertures 90, 92 are formed through a rearward portion of the face section transversely across from one another; the left aperture 90 being for receipt of a rheostat 94 and the right aperture 92 being for receipt of a toggle switch 96. The forward end 98 of the face section is angled upwardly and forwardly and includes a large aperture 100 for receipt of a voltmeter 102, and also includes screw-receiving apertures 104 spaced about the voltmeter aperture 100 for receipt of self-locking screws which secure the voltmeter 102 to the face section 88. The voltmeter face 106 is thus caused to be angled upwardly to provide easy readability for the operator. Two apertures 108 are formed in the forward end of the upper casing portion of the control section for receipt of self-locking screws 110 which register with corresponding apertures 112 in the terminal block 114 to secure the terminal block 114 to the upper casing portion. Two apertures 116 are also formed in the inwardly stepped forward portion of the bottom casing portion of the control section for receipt of self-locking screws 118 to connect the bottom casing portion of the control section with corresponding apertures 120 in the terminal block 114.

The upper casing and the lower casing of the housing are each molded unitarily into hard plastic casings. Preferably the outside of the housing is textured to provide a better grip for the operator.

The terminal block 114 is also formed of a nonconductive material such as Nylon or other synthetic material. The terminal block 114 is generally L-shaped and includes horizontal 122 and vertical 124 flanges extending outwardly from each leg of the L. Flanges 126 also extend out to each side of the block 114 but are formed as a single unit with the block 114. A transverse slot 128 is formed horizontally through the vertical leg 124 of the L and is adapted to receive four probes 130, 132, 134, 136 which are used to contact commutator bars 4 of the armature 2 to be tested. Screw-receiving apertures 112 are formed in the upwardly extending flange 124 and are placed in registry with corresponding holes 108 in the front end of the upper casing portion of the control section. The terminal block 114 is detachably secured to the upper casing portion of the control section by fasteners such as self-locking screws 110. Screw receiving apertures 120 are also formed in the sidewardly extending horizontal flanges which register with corresponding apertures 116 in the lower casing portion of the control section to connect the upper and lower casing portions. It is preferable that threaded metal sleeves 138 are inserted into the apertures which receive the aforementioned screws to provide a more secure holding force and less chance of stripping. Four screw receiving apertures 140 are formed along a transverse line through the horizontal leg of the L for receipt of four terminal screws 142, 142A, 142B, 142C which are used to make electrical connections between the probes 130, 132, 134, 136 and the circuitry 144 of the tester.

As mentioned before, two wires 48, 50 respectively connected to each of the resilient terminals 40, 42 for the batteries and extend through a hole 52 in the inner skin of the upper casing portion of the handle. The wire 50 which connects with the positive terminal 42 of the batteries extends and connects with the leftward most terminal screw 142C which thus connects with the leftward most probe 130. The wire 48 which attaches to the negative terminal 40 of the batteries extends and connects with one terminal 146 of the toggle switch 96. From the other terminal 148 of the toggle switch 96, the wire 150 extends and connects with one terminal 160 of the rheostat, and from the other terminal 164 of the rheostat a wire extends and connects with terminal screw 142A. Thus, when the toggle switch 96 is closed, the battery introduces a voltage across probes 130, 134 and when these probes are contacted with two commutator bars 4, 4B of an armature 2, a voltage is introduced thereacross. Although those skilled in the art will realize that various rheostats can be used, it is preferable to use one of low resistance such as a 75 ohm rheostat. This will allow the testing device to test the coil windings of virtually any armature.

The remaining two probes 132, 136 attach respectively with the two terminal screws 142B, 142. A wire 152 attaches to, and extends from, terminal screw 142B and connects with one terminal 154 of the voltmeter 102. A wire 156 then connects the other terminal 158 of the voltmeter with terminal screw 142.

Therefore, when the toggle switch 96 is closed and the four probes 130–136 contact four adjacent commutator bars 4, 4A, 4B, 4C of an armature 2 probes 130, 134 introduce a voltage across commutator bars 4A, 4C and thus across the winding 132, 136 then connect with the commutator bars 4B, 4 and thereby introduce the voltage, which is across the coil connecting into the commutator bar 4B, to the voltmeter.

The voltmeter 102 then indicates the voltage thereacross by having the needle indicator 166 point to an area of the face of the voltmeter corresponding to the voltage. The rheostat may be adjusted for various sizes and types of armatures so that the same beginning reference point can always be used on the voltmeter face for testing of any armature. In the preferred embodiment, the face of the voltmeter includes a scale 168 with color-coded and labeled portions to which an indicator needle 166 will point to respectively indicate various states of the windings of the armature. When the needle indicator points to one section of the face it indicates that the coil being tested (i.e. the coil connecting into bar 4B) has been reversed in some manner, such as by a winding being crossed; when the indicator needle points to another section of the face of the voltmeter, it indicates that the coil is broken such that there is an open circuit; when the needle points to a still further section of the face it indicates that the coil is shorted. A fourth indicating section is provided on the face to show that the coil is installed and functioning properly.

As shown in FIG. 6, each of the probes 130–136 has an insulating layer 130A, 132A, 134A, 136A which covers the rearward exposed portion of its corresponding probe. The forward end of each probe is, however, left uncovered such that it can make electrical contact with a commutator bar. The exposed area of the probe is preferably about ⅜ of an inch. It is preferred that each of probes 130, 134, and 136 has an insulating layer 130A, 134A and 136A of one color (such as black) and that probe 132 has an insulating layer 132A of a different color (such as red) so as to indicate which probe is contacting the commutator bar being tested. Red probe 132A indicates exact trouble spot of circuit.

As discussed before, each of the probes 130–136 is connected to a corresponding one of the terminal screws 142, 142A, 142B, 142C and extends therefrom through the slot 128 in the front of the L-shaped terminal block 114. An eyelet terminal 170 is soldered to each of the probes and receives a terminal screw through its eye. On top of the eyelet, a nut 172 is screwed onto each terminal screw and a foldable-type lock washer 174 is secured onto the top of the nut 172. Above this washer an L-shaped terminal bracket 176 is received over each terminal screw. The vertical portion of each L is adjacent to the vertical portion of the L-shaped terminal block and receives the terminal connection 178, which can be a solder connection as shown or, more preferably, a slide connector such as is commonly used in making such electrical connections, of its corresponding wire. A lock washer 180 is then introduced on the screw above the L-shaped terminal bracket 176 and another nut 182 is threaded onto the top of the screw to secure all of the aforementioned components. With this arrangement a slight loosening of each terminal screw will allow its corresponding probe to be adjusted laterally to thereby adapt the testing device to various sized armatures.

The present invention thus provides a very portable and easy to handle bar-to-bar tester for testing the connections and the condition of the coils of an armature. Because of the variability of the resistance of the voltmeter circuit provided by the rheostat 94, and because of the adjustability of the four probes 130–136, this testing device can be used to test the condition of virtually any size or type of armature. The arrangement of the circuit 144 and the use of a single pole switch rather than a double or tripole switch, allows the tester to work accurately with a lesser energy drain on the DC source. Thus, the batteries will last considerably longer than in the prior art devices. The fact that the casing and the terminal block are of nonconductive synthetic materials ensures that the readings will not be inaccurate because of contact by a conductor with conductive portions of the armature.

The design of the housing is such that the upper 22 and lower 24 casing portions can be separated by the mere extraction of three screws. This allows easy access to the batteries and to other components within the casing. The terminal block can also be readily separated from the housing so as to replace or repair it if needed.

In operation, the testing device is held in one's hand with the probes contacting four different adjacent commutator 4, 4A, 4B, 4C bars of an armature 2. The toggle switch 96 is then placed in the "on" position (i.e. to close the circuit) and the rheostat 94 is adjusted so that the reading on the voltmeter is at a reference point 190 which may include an ("OK" label). Once this adjustment has been made, the operator is ready to test each of the windings in the armature. This is accomplished by moving the four probes over by one commutator bar (i.e. such that each probe contacts a commutator bar adjacent to the commutator bar it contacted during adjustment of the rheostat), reading the voltmeter to see if the voltage is in the "OK" range on the voltmeter, and then successively moving the probes around the armature one commutator bar at a time. By this simple process, each and every winding of the armature can be readily checked to see if it is shorted, broken, reversed or properly installed. As shown in FIG. 1, the indicating face of the voltmeter is divided into four sections. In the preferred embodiment, the left most section 192 may be labeled "REV" and is colored yellow. In the center the range 194 may be labeled "SHORT" and colored red. At the three-quarter point 190, the scale may be labeled with "OK" and colored green. And at the far right 196, the scale may be labeled "OPEN" and colored black.

Many variations of the embodiment disclosed may be made without departing from the spirit and scope of the invention. Thus, it is to be understood that this invention is not to be limited to the disclosed embodiment except as defined in the appended claims.

What is claimed is:

1. A tester for testing electric motor armature windings to determine whether each of said windings is shorted, open, reversed, or properly installed and unbroken, comprising:
   a hollow housing having a front end and a rear end;
   first, second, third and fourth electrically conductive elongated probes connected to and extending forwardly from said front end of said housing and positioned respectively successively in side-by-side spaced relation;

source means, disposed within said hollow housing and electrically connected across said first and third probes, for providing a voltage across a selected coil winding of said armature;

indicator means disposed within said hollow housing and electrically connected across said second and fourth probes, for detecting and indicating whether said selected coil winding is shorted, whether said selected coil winding is open, whether said selected coil winding is reversed, or whether said selected coil winding is proper; and probe marking means on said second probe for marking which of said probes is contacting an armature bar which is directly connected to said selected coil winding.

2. A tester as recited in claim 1, wherein said indicator means comprises a voltmeter including a face with designations thereon and an indicating pointer, movable between said designations, for indicating whether said selected coil winding is shorted, open, reversed or proper.

3. A tester as recited in claim 2, further comprising:

rheostat means, electrically connected across said first and third probes, for adjusting the voltage induced across said first and third probes to a reference voltage.

4. A tester as recited in claim 3, wherein said reference voltage is a voltage sufficient to cause said indicating pointer to point to a mid-point on said face, when the four probes are contacted with four successive armature bars which are electrically connected by proper coil windings.

5. A tester as recited in claim 1, wherein said first, second, third and fourth probes are each independently adjustably connected to said housing for pivoting about four respective axes perpendicular to said probes.

6. A tester as recited in claim 5, wherein said axes of said first, second, third and fourth probes are defined by axes of four mounting screws to which said probes are adjustably mounted.

7. A tester as recited in claim 1 wherein said hollow housing comprises a hollow control section adjacent said front end and a hollow handle section adjacent said rear end, said hollow housing being formed of non-conductive material.

8. A tester as recited in claim 1, wherein a rear end of each of said probes is pivotally adjustably mounted about a pivot axis, such that spacing of said forward ends of said probes can be varied.

9. A tester for testing electric motor armature windings, comprising:

a hollow housing having a control section at a front end thereof and a handle section at a rear end thereof, and including top and bottom faces;

a terminal block removably attached to a forward end of said control section of said hollow housing, said terminal block having an elongated transverse slot therethrough forming an opening in said forward end of said control section;

first, second, third and fourth electrically conductive elongated probes disposed through said slot and adjustably mounted to a rearward portion of said terminal block, said first, second, third and fourth probes being respectively successively spaced along said transverse slot and being adapted for contact with four respectively successively located armature commutator bars;

a voltage source disposed within said hollow housing and electrically connected between said first and third probes;

a voltmeter disposed in said ;hollow housing and electrically connected between said second and fourth probes, said voltmeter including an indicating face and being mounted such that said indicating face is viewable from outside of said hollow housing;

a rheostat electrically connected with said voltage source between said first and third probes for selectively varying the voltage induced across said first and third probes to a reference voltage;

means for marking said second probe as being the probe which is contacting an armature commutator bar to which an armature winding being tested is directly connected.

10. A tester as recited in claim 9, wherein said indicating face of said voltmeter includes a pointer and four designation zones to which said pointer will point upon said second probe contacting commutator bars connected to coils which are shorted, reversed, proper or open, respectively, said reference voltage being a voltage sufficient to cause said pointer to point to a first of said designation zones located at center of said indicating face.

11. A tester as recited in claim 10, wherein said first designation zone is for indicating a shorted coil, a second designation zone for indicating a reversed coil is located to a first side of said first designation zone, a third designation zone for indicating a proper coil is located to a second side of said first designation zone, and a fourth designation zone for indicating an open coil is located to a side of said third designation zone opposite said first designation zone.

* * * * *